(12) United States Patent
Dally

(10) Patent No.: US 8,930,862 B2
(45) Date of Patent: Jan. 6, 2015

(54) SYSTEM, METHOD, AND COMPUTER PROGRAM PRODUCT FOR AUTOMATIC TWO-PHASE CLOCKING

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/787,705

(22) Filed: Mar. 6, 2013

(65) Prior Publication Data

US 2014/0253175 A1    Sep. 11, 2014

(51) Int. Cl.
*G06F 17/50*    (2006.01)
*H03K 19/096*   (2006.01)

(52) U.S. Cl.
CPC .................................. *H03K 19/096* (2013.01)
USPC ........... 716/103; 716/107; 716/112; 716/113; 716/132; 716/134; 716/136; 327/57; 327/107; 327/197

(58) Field of Classification Search
USPC ......... 716/103, 107, 112, 113, 132, 134, 136; 327/57, 107, 197
See application file for complete search history.

(56) References Cited

U.S. PATENT DOCUMENTS

| | | | | |
|---|---|---|---|---|
| 6,081,656 A | * | 6/2000 | Witt | 716/103 |
| 6,457,161 B1 | * | 9/2002 | Nadeau-Dostie et al. | 716/103 |
| 7,634,749 B1 | * | 12/2009 | Cortadella et al. | 716/100 |

OTHER PUBLICATIONS

Yoshikawa et al., Timing optimization by replacing Flip-Flop to Latches, 2003, NEC corp. pp. 1-6.*
Lalgudi et al., Fixed-phase Retiming for Low-Power Design, Jan. 1995, Yale University Department of Computer Science (YALEU/DCS/RR-1063), pp. 1-13.*
Fojtik, M. et al., "Bubble Razor: An Architecture-Independent Approach to Timing-Error Detection and Correction," Proc. ISSCC, 2012.

* cited by examiner

*Primary Examiner* — Nghia Doan
(74) *Attorney, Agent, or Firm* — Zilka-Kotab, PC

(57) ABSTRACT

A system, method, and computer program product for converting a design from edge-triggered docking to two-phase non-overlapping clocking is disclosed. The method includes the steps of replacing an edge-triggered flip-flop circuit that is coupled to a combinational logic circuit with a pair of latches including a first latch circuit and a second latch circuit and determining a midpoint of the combinational logic circuit based on timing information. The second latch circuit is propagated to a midpoint of the combinational logic circuit and two-phase non-overlapping clock signals are provided to the pair of latches.

14 Claims, 10 Drawing Sheets

SYSTEM, METHOD, AND COMPUTER PROGRAM PRODUCT FOR AUTOMATIC TWO-PHASE CLOCKING

FIELD OF THE INVENTION

The present invention relates to circuits, and more specifically to two-phase docking of circuits.

BACKGROUND

Conventional devices such as microprocessors and graphics processors typically rely on edge-triggered flip-flops for pipelining datapaths and for implementing sequential logic. When the logic between two edge-triggered flip-flops has a small delay, specifically when the delay approaches the hold time needed for proper operation, additional circuitry is inserted into the path by timing tools to fix the hold time violations. Other than to ensure that hold time violations are fixed, the insertion of additional circuitry is undesirable because of the additional circuitry occupies space on the die and consumes power during operation.

Thus, there is a need for reducing hold time violations and/or addressing other issues associated with the prior art.

SUMMARY

A system, method, and computer program product for converting a circuit design from edge-triggered clocking to two-phase non-overlapping clocking is disclosed. The method includes the steps of replacing an edge-triggered flip-flop circuit that is coupled to a combinational logic circuit with a pair of latches including a first latch circuit and a second latch circuit and determining a midpoint of the combinational logic circuit based on timing information. The second latch circuit is propagated to a midpoint of the combinational logic circuit and two-phase non-overlapping dock signals are provided to the pair of latches.

DETAILED DESCRIPTION

Timing performance of a circuit design using edge-triggered flip-flops may be improved by converting the circuit design to use latches clocked using two-phase non-overlapping clocks. Hold time violations are eliminated because the two-phase clocking uses two-phase non-overlapping clock signals to separately enable a master latch and a slave latch. There is no need to insert additional circuitry into paths to fix hold time violations. Also, time borrowing between the phases makes the circuitry less sensitive to clock jitter and skew, further improving timing margins.

Figure 1A:
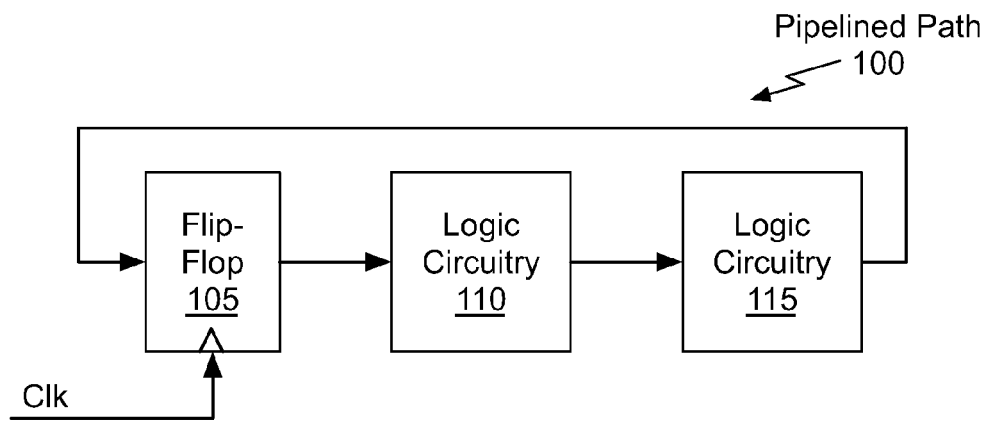
FIG. 1A illustrates a path that is pipelined using edge-triggered clocking with combinational logic circuitry split, in accordance with one embodiment.

FIG. 1A illustrates a pipelined path 100 including a flip-flop 105 using edge-triggered clocking with combinational logic that has been split, in accordance with one embodiment. The combinational logic has been split into two portions, logic circuitry 110 and 115 having approximately equal delays. The combinational logic is split at a midpoint that is a node were a propagation delay of a signal from the output of the flip-flop 105 through the logic circuitry 110 approximately equals the propagation delay of the signal through the logic circuitry 115 to the input of the flip-flop 105. In one embodiment, the midpoint is identified using a conventional timing analysis tool that generates timing information for the pipelined path 100.

Figure 1B:
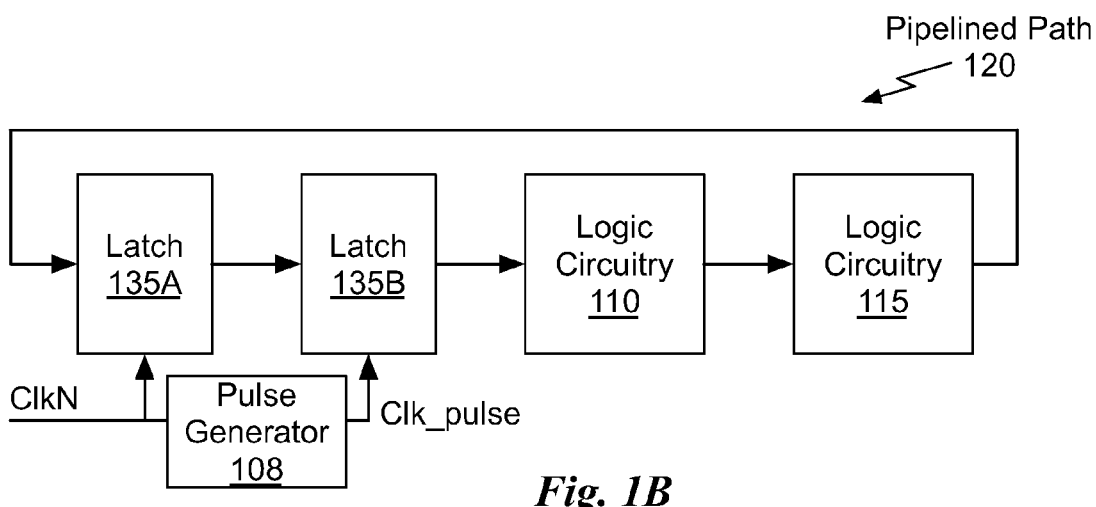
FIG. 1B illustrates the path shown in FIG. 1A that is converted to use two-phase non-overlapping clocking, in accordance with one embodiment.

FIG. 1B illustrates the pipelined path 120 that is produced by converting the pipelined path 100 shown in FIG. 1A to use two-phase non-overlapping clocking, in accordance with one embodiment. The flip-flop 105 is replaced with a pair of latches 135A and 135B. The latch 135A is driven directly by clkN and the latch 135B is driven by Clk_pulse, two-phase non-overlapping clock pulse output by a pulse generator 108. For each pulse of clkN, the pulse generator 108 generates a narrowed version of elk (i.e., inverted clkN) that is centered during the time within a clock period when clkN is low. While the pipelined path 120 is a converted pipelined path that does function properly, like the pipelined path 100, the pipelined path 120 has a large insertion delay because of the delay introduced in the pulse generator 108 to ensure that the pulses of clkN and clk_pulse do not overlap due to clock skew.

Figure 1C:
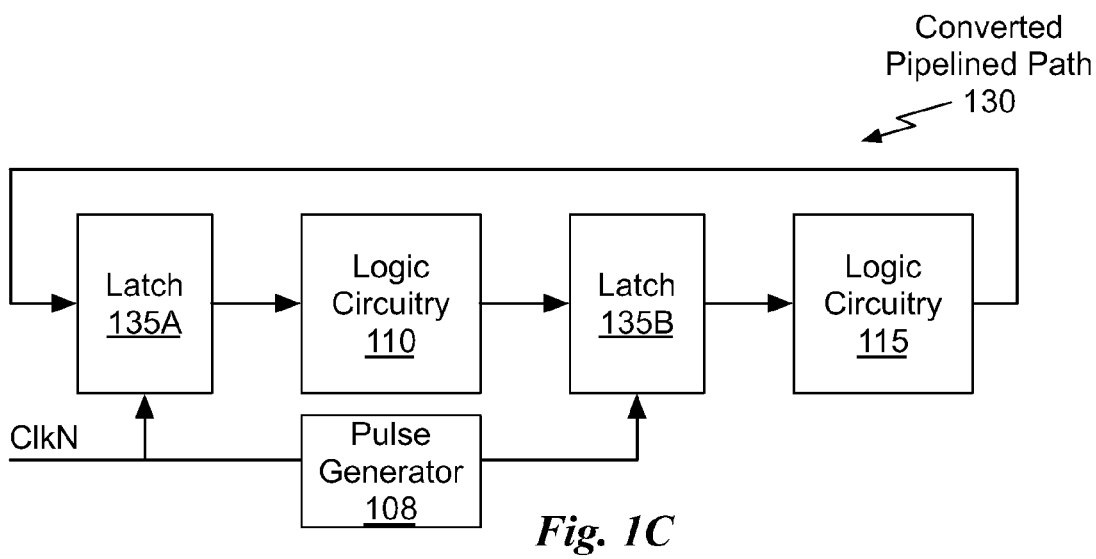
FIG. 1C illustrates the path shown in FIG. 1B with the split combinational logic circuit distributed between latches, in accordance with one embodiment.

FIG. 1C illustrates a converted pipelined path 130 that is produced by converting the pipelined path 120 shown in FIG. 1B to propagate the second latch of the latch pair to a midpoint of the split combinational logic, in accordance with one embodiment. The latch 135A may be configured as a master latch that incorporates scan circuitry and the latch 135B may be configured as a slave latch. The latch 135B is propagated to a position between the logic circuitry 110 and the logic circuitry 115. Compared with the pipelined path 100, the converted pipelined path 130 has lower insertion delay, is largely insensitive to clock skew and jitter, and may implement time borrowing techniques to meet timing constraints. Time borrowing allows the logic circuitry 115 to have a greater delay compared with the logic circuitry 110, or vice versa, so that time is "borrowed" across the latch 135B while the combined delay of the logic circuitry 110 and 115 meets the timing constraints for a clock cycle. Because the delay of the combinational logic varies from one input to different outputs the delay to the input of the latch 135B may differ from the delay to the input of the latch 135A after the latch 135A is propagated.

Figure 2:
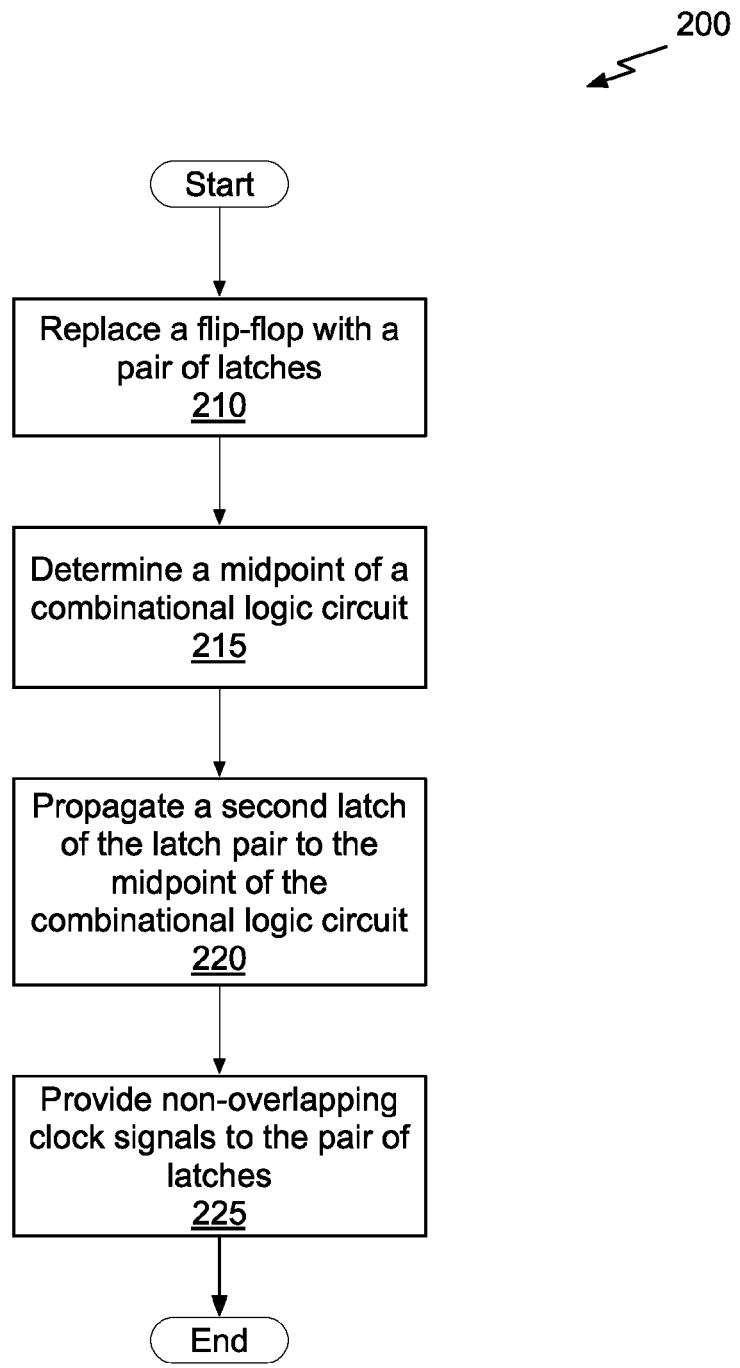
FIG. 2 illustrates a flowchart of a method for converting a circuit design from edge-triggered clocking to two-phase non-overlapping clocking, in accordance with one embodiment.

FIG. 2 illustrates a flowchart 200 of a method for converting a circuit design from edge-triggered clocking to two-phase non-overlapping clocking, in accordance with one embodiment. At step 210, an edge-triggered flip-flop circuit that is coupled to a combinational logic circuit is replaced with a pair of latches (i.e., a master latch circuit and a slave latch circuit). At step 215, a midpoint of the combinational logic circuit is determined based on timing information. At step 220, the second latch circuit is propagated to a midpoint of the combinational logic circuit. At step 225, two-phase non-overlapping clock signals are provided to the pair of latches.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

The propagation of latches along paths within combinational logic circuits may be accomplished using the tools that are used to perform automatic retiming. In one embodiment, a circuit design using edge-triggered clocking may be converted to use two-phase non-overlapping clocking by including twice as many pipeline stages as needed in the circuit design. Automatic reaming tools may be used to distribute the edge-triggered flip-flops evenly throughout the propagation delay of the logic circuitry, and then to replace the edge-triggered flip-flops with latch pairs. The two-phase non-overlapping clock signals are then provided to the latch pairs, with a first latch of each latch pair receiving the clock signal clkN and a second latch of each latch pair receiving the clock signal clk_pulse.

When two-phase non-overlapping clocking is used instead of edge-triggered clocking, the effects of clock skew and clock jitter are reduced. Insertion delay is also minimized when each flip-flop having a large insertion delay $t_s+t_{dcq}$ is replaced with a pair of non-restoring latches that have a smaller propagation delay, where $t_s$ is setup time and $t_{dcq}$ is the delay from a clock edge to a transition of the output Q.

To achieve a low insertion delay, the propagation delay of the latch should be made as low as possible. One approach to a low-delay latch circuit is to take advantage of the logic stage that follows the latch (i.e., logic circuitry 110 or logic circuitry 115) to provide restoring amplification. Therefore, the latch itself may be non-restoring. However, a non-restoring static latch should be placed close to the logic stage following the non-restoring static latch to avoid potential crosstalk-disturb issues that may cause the value of a storage node within the latch to be flipped. In other words, the length of a wire coupling the output of the non-restoring static latch should be limited to ensure that the logic stage following the non-restoring static latch is close to the non-restoring static latch.

Figure 3A:
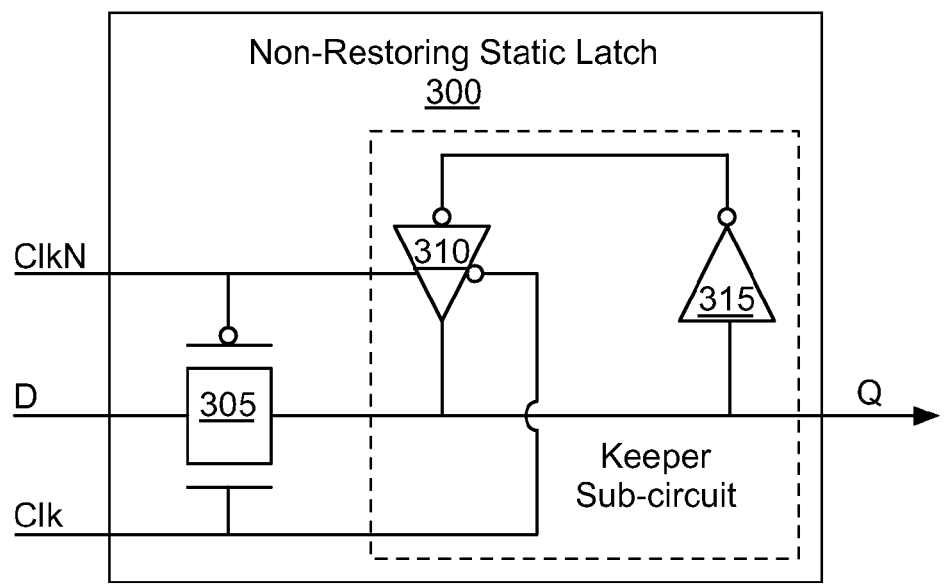
FIG. 3A illustrates a non-restoring static latch circuit, in accordance with one embodiment.

FIG. 3A illustrates a non-restoring static latch circuit 300, in accordance with one embodiment. The non-restoring static latch circuit 300 may be used to implement the master latch 135 and/or the slave latch 140 shown in FIG. 1C. The non-restoring static latch circuit includes a CMOS transmission gate 305 and a keeper sub-circuit. When the clock input (Clk) is high, the transmission gate 305 transmits the input (D) to the output (Q) making the non-restoring static latch circuit 300 transparent. When the clock input is low, the transmission gate is off and the output becomes the storage node of the non-restoring static latch circuit 300. When the clock input is low, the keeper sub-circuit is active and restores any charge lost on the storage node due to leakage or noise, making the non-restoring static latch circuit 300 static.

The non-restoring static latch circuit 300 has minimal insertion delay. Using an Elmore delay model, the propagation delay of the non-restoring static latch circuit 300 is just an RC delay, where R is the resistance of the transmission gate 305 and C is the capacitance of the keeper sub-circuit and the static gate following the non-restoring static latch circuit 300. When the non-restoring static latch circuit 300 is placed close to the static gate on the silicon die, the capacitance of the wire from the gate that drives the input is isolated from the resistance of the transmission gate 305.

As used herein, transistors are coupled directly to a signal if the signal is coupled to the transistor without any intervening logic, and the transistors are coupled indirectly to a signal if the signal is coupled to the transistor with intervening logic. Intervening logic may be any type of discrete logic. For example, a transistor may be connected to a ground or supply voltage indirectly through additional circuit elements that comprise a current source.

Figure 3B:
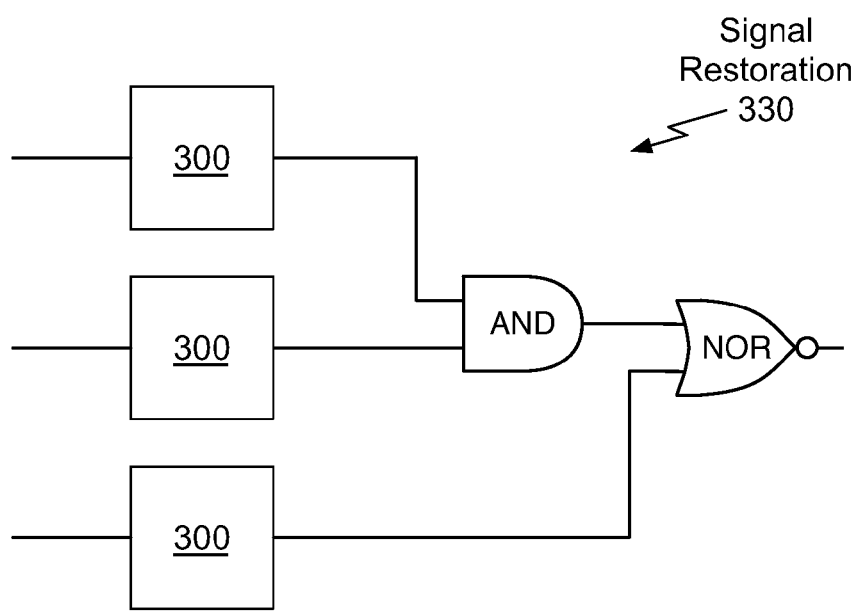
FIG. 3B illustrates non-restoring static latches coupled to restoring logic, in accordance with one embodiment.

FIG. 3B illustrates a circuit design for signal restoration 330, where non-restoring static latch circuits 300 are coupled to restoring logic, in accordance with one embodiment. To minimize disturbances of the storage node in the non-restoring static latch circuits 300, the output of the non-restoring static latch circuits 300 should only be coupled to inputs of static gates, e.g., inverters, buffers, NAND, NOR, OR, AND, etc. A static gate produces output(s) that are pulled up or down to VDD or VSS (except during a switching transient). The output of the non-restoring static latch circuits 300 should not be directly connected to a transmission gate (complementary or not). If the input signal D is degraded (i.e., not at a high voltage level or at a low voltage level) the signal level that is transmitted to the output signal Q is also degraded and should be input to restoring logic. As shown in FIG. 3B, three non-restoring static latch circuits 300 drive the inputs of a three-input AND-OR-INVERT gate. The non-restoring static latch circuits 300 each drive only inputs of static gates (i.e., restoring logic).

Conventionally, a circuit design is represented in a hardware design language and the code representing the circuit design is synthesized to produce the physical layout. The physical layout representing the cells (e.g., non-restoring static latch circuits 300, individual logic gates, etc.) are separately instantiated and then routed to connect signals between the various components. In one embodiment, hard macros comprising the physical circuit layout are constructed that combine the non-restoring static latch circuit 300 with each gate type that may be coupled to the output of a non-restoring static latch circuit 300 to ensure that each non-restoring static latch circuit 300 and the restoring gate is close to the non-restoring static latch circuit 300 (i.e., that the length of the wiring between each non-restoring static latch circuit 300 and restoring gate is limited). The total circuit layout area may be smaller when the hard macros are used. In another embodiment, circuit placement tools are configured to give a very high priority to keeping the wiring between the non-restoring static latch circuits 300 and restoring gates short, and a post-placement check is performed to ensure that wires do not exceed a maximum length.

Figure 3C:
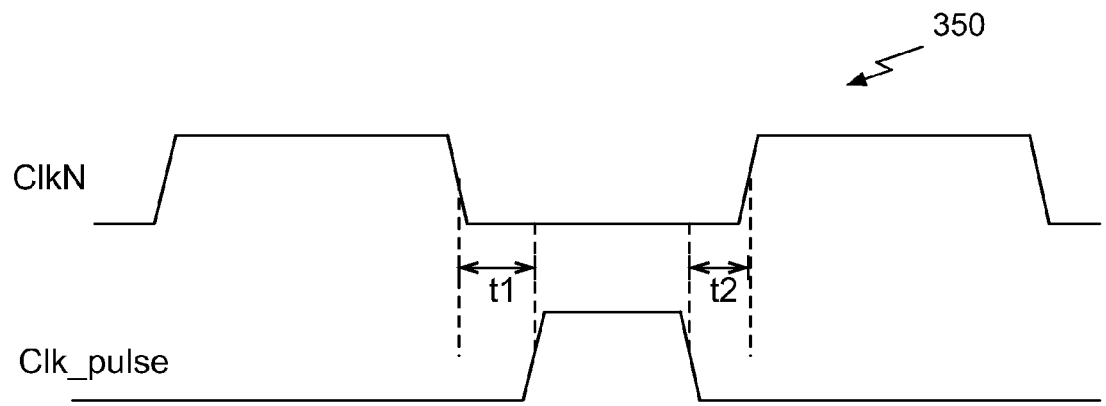
FIG. 3C illustrates a timing diagram of the two-phase non-overlapping clock signals, in accordance with one embodiment.

FIG. 3C illustrates a timing diagram 350 of the two-phase non-overlapping clock signals, ClkN and Clk_pulse, in accordance with one embodiment. A first non-restoring static latch circuit 300 of a latch pair (i.e., the master latch) is driven by clkN (the negated clock). A second non-restoring static latch circuit 300 of the latch pair (i.e., the slave latch) is driven by Clk_pulse, the output of the pulse generator 108. Clk_pulse is a narrowed version of the clock. In other words, Clk_pulse is slightly narrower than half a clock cycle. The non-overlap periods $t_1$ and $t_2$ are set to tolerate skew and jitter in the clock distribution network.

Figure 3D:
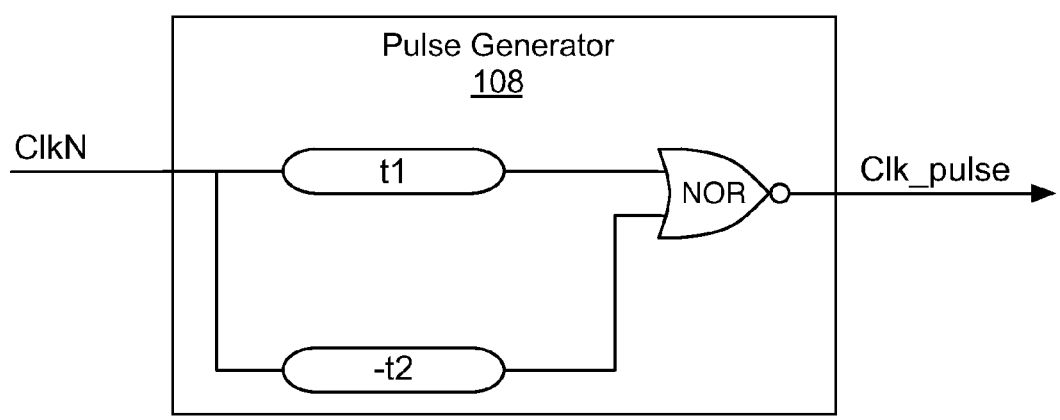
FIG. 3D illustrates a pulse generation circuit, in accordance with one embodiment.

FIG. 3D illustrates a pulse generation circuit 108, in accordance with one embodiment. The signal Clk_pulse can be generated by a single NOR gate from advanced and retarded versions of clkN as shown in FIG. 3D. The advanced and delayed versions of clkN can be generated at no cost by performing clock-tree generation with productive skew.

The two-phase non-overlapping clocking scheme is compatible with conventional clock-tree synthesis and clock gating. Clock-tree synthesis can be used to distribute the single clock phase, clkN. The clock for the slave phase, clk_pulse, is then generated by a NOR-gate pulse generator. Because the pulse generation timing is non-critical, significant amounts of skew and delay variation can be tolerated. Clock gating is performed by gating clkN low. Gating clkN low causes clk_pulse to be high when the clock is stopped.

Figure 4A:
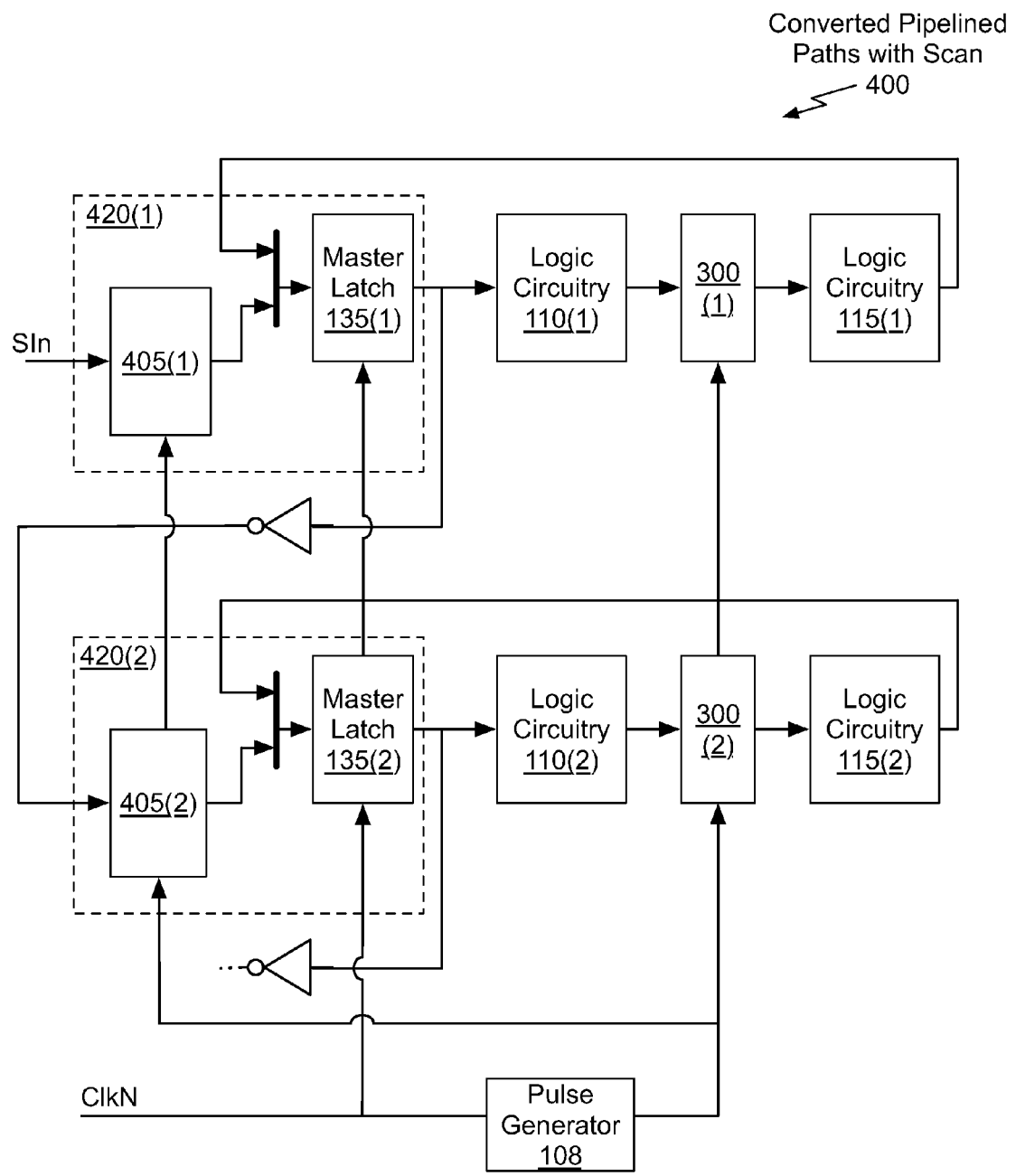
FIG. 4A illustrates a path that is converted to use two-phase non-overlapping clocking with scan, in accordance with one embodiment.

FIG. 4A illustrates converted pipelined paths with scan circuitry 400 that use two-phase non-overlapping clocking, in accordance with one embodiment. A circuit design using edge-triggered flip-flops to implement a scan path can be converted to use two-phase non-overlapping clocking by inserting a multiplexer in front of each master non-restoring static latch circuit 300 shown as master latches 135(1) and 135(2) and adding a redundant slave latch shown as the non-restoring static latch circuits 405(1) and 405(2) along the scan path. The non-restoring static latch circuits 405(1) and 405(2) are clocked by Clk_pulse and the non-restoring static latch circuits 405(1) receives the scan input, Sin. When the scan path is enabled, the first multiplexer selects the output of the non-restoring static latch circuits 405(1) for input to the master latch 135(1) and the second multiplexer selects the output of the non-restoring static latch circuits 405(2) for input to the master latch 135(2) to produce the scan path.

Figure 4B:
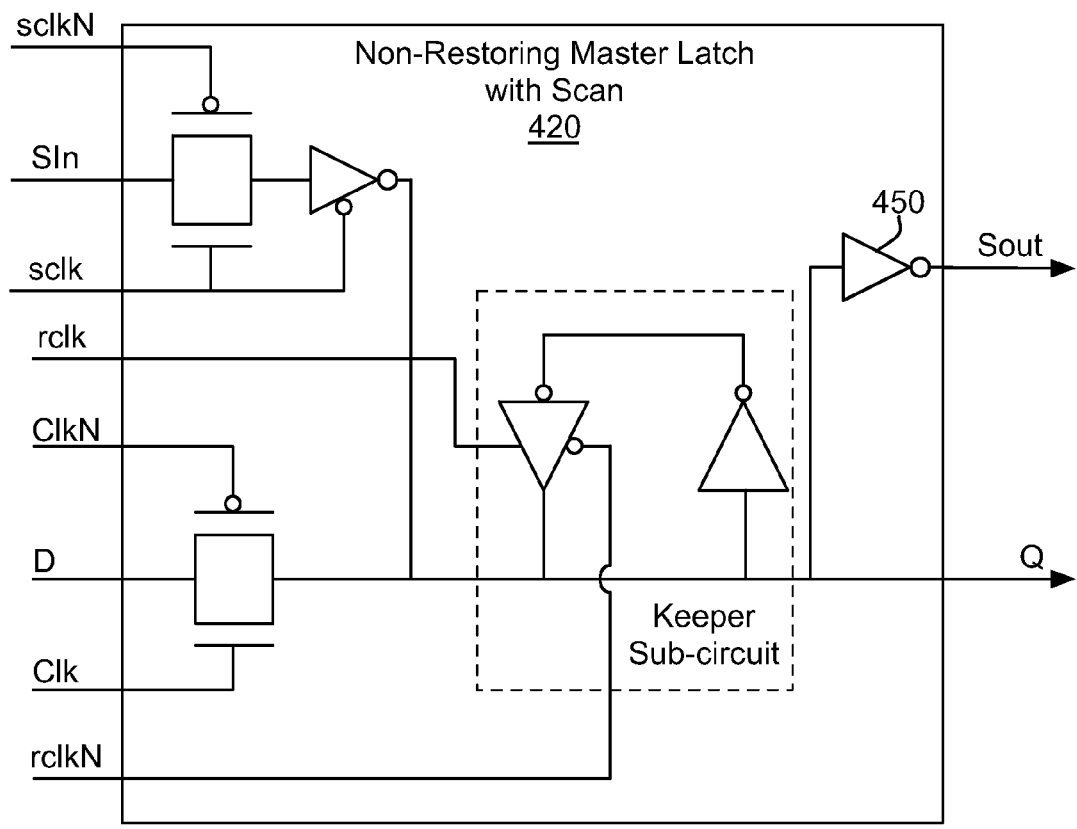
FIG. 4B illustrates a non-restoring master latch with scan circuit, in accordance with one embodiment.

FIG. 4B illustrates a non-restoring master latch with scan circuit 420, in accordance one embodiment. Compared with the master latch cell circuits shown in FIG. 4A, the multiplexer is combined with the transmission gate input of the non-restoring static latch circuit that receives the scan input (Sin) so that insertion delay is not increased when scan is added to a circuit design. The non-restoring master latch with scan circuit 420 includes a restoring inverter 450 for the scan path that outputs the scan output (Sout). During normal operation, the normal clock (clkN, elk) signals cycle and the scan clock (sclk, sclkN) signals are held in an inactive state (sclk=0, sclkN=1). During scan operation the normal clock (clkN, clk) signals are held in an inactive state (clk=0, clkN=1) and the scan clock signals cycle. A restoration clock signal (rclk, rclkN) cycles in both states to activate the keeper sub-circuit and generate Q and Sout.

Logic blocks using the two-phase non-overlapping clocking can be mixed freely with logic that is pipelined using edge-triggered flip-flops. Newly designed circuit blocks that use the two-phase non-overlapping clocking may interoperate with existing circuit blocks using edge-triggered clocking. The two-phase non-overlapping clocking may be applied only to critical parts of a circuit design, leaving the balance of the design to use edge-triggered clocking.

Figure 5A:
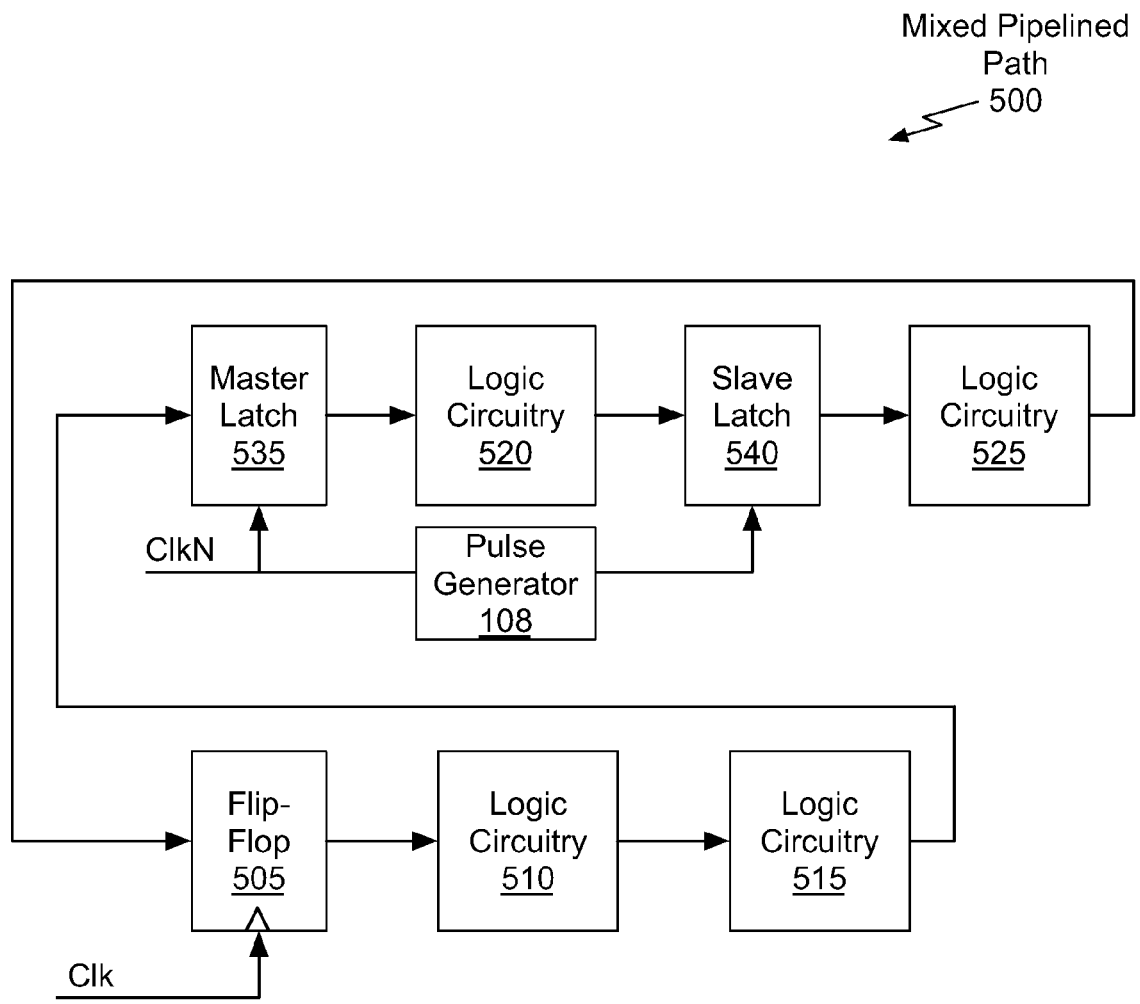
FIG. 5A illustrates a path that uses both two-phase non-overlapping clocking and edge-triggered clocking, in accordance with one embodiment.

FIG. 5A illustrates a mixed pipelined path 500 that uses both two-phase non-overlapping clocking and edge-triggered clocking, in accordance with one embodiment. The master latch 535 and slave latch 540 comprise a latch pair configured to use two-phase non-overlapping clocks and the flip-flop 505 is an edge-trigger flip-flop. The master latch 535 may be implemented as the non-restoring static latch 300 or the non-restoring master latch with scan 420. The slave latch 540 may be implemented as the non-restoring static latch 300. As long as interval t1 is larger than the hold time of the edge triggered flip-flop 505, the mixed pipelined path 500 is guaranteed to be hold-time safe even if logic circuitry 525 has zero delay. The mixed pipelined path 500 permits time borrowing in one direction by the logic circuitry 520 and the logic circuitry 525 that are driven by the non-restoring static latch circuits (e.g., master latch 535 and slave latch 540). The logic circuitry 520 can use up to a half-cycle of slack left by the logic circuitry 510 and 515. The logic circuitry 525 can use up to a half cycle of slack left by the logic circuitry 520. Time can be "borrowed" across the master latch 535 and across the slave latch 540.

Figure 5B:
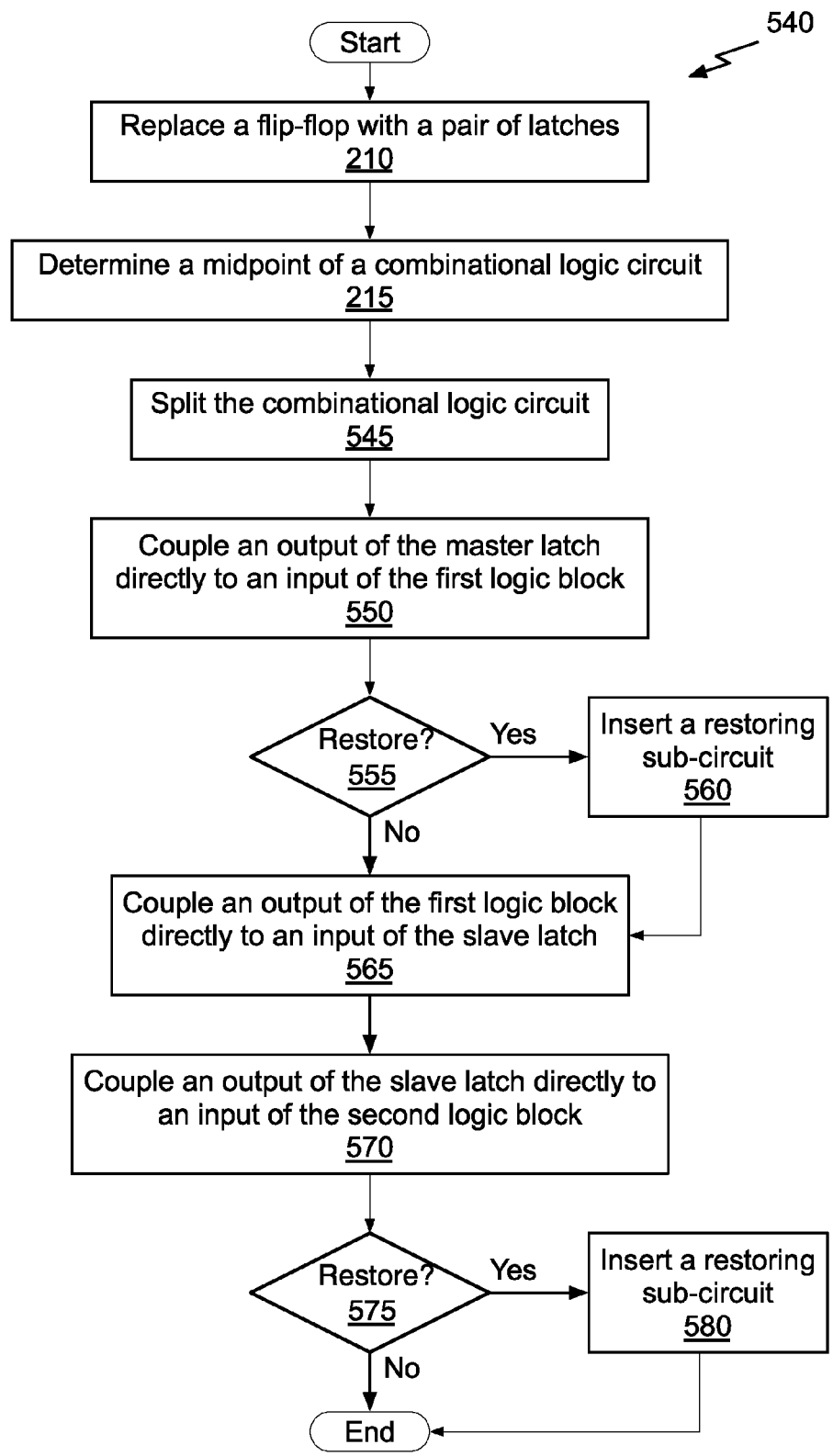
FIG. 5B illustrates a flowchart of a method for converting a circuit design from edge-triggered clocking to two-phase non-overlapping clocking, in accordance with one embodiment.

FIG. 5B illustrates a flowchart 540 of a method for converting a circuit design from edge-triggered clocking to two-phase non-overlapping clocking, in accordance with one embodiment. The method may be performed by a computer program. At step 210, an edge-triggered flip-flop circuit that is coupled to a combinational logic circuit is replaced with a pair of latches (i.e., a master latch circuit and a slave latch circuit). In one embodiment, a computer program operates on HIM code that represents the circuit design to replaces the edge-triggered flip-flop circuit with the pair of latches. At step 215, a midpoint of the combinational logic circuit is determined based on timing information. In one embodiment, timing analysis tools are executed to generate the timing information for a circuit design. At step 545, the combinational circuit is split into a first logic block and a second logic block.

At step 550, an output of the first latch circuit is directly coupled to an input of the first logic block. At step 555, the method determines if the input of the first logic block is restoring logic, and, if not, then at step 560, a restoring sub-circuit (e.g., inverter, buffer, logic gate, etc.) is inserted at the output of the first latch circuit before continuing to step 565. At step 565, an output of the first logic block is directly coupled to an input of the second latch circuit. At step 570, an output of the second latch circuit is directly coupled to an input of the second logic block. At step 575, the method determines if the input of the second logic block is restoring logic, and, if not, then at step 580, a restoring sub-circuit is inserted at the output of the second latch circuit before the method terminates.

Figure 6A:
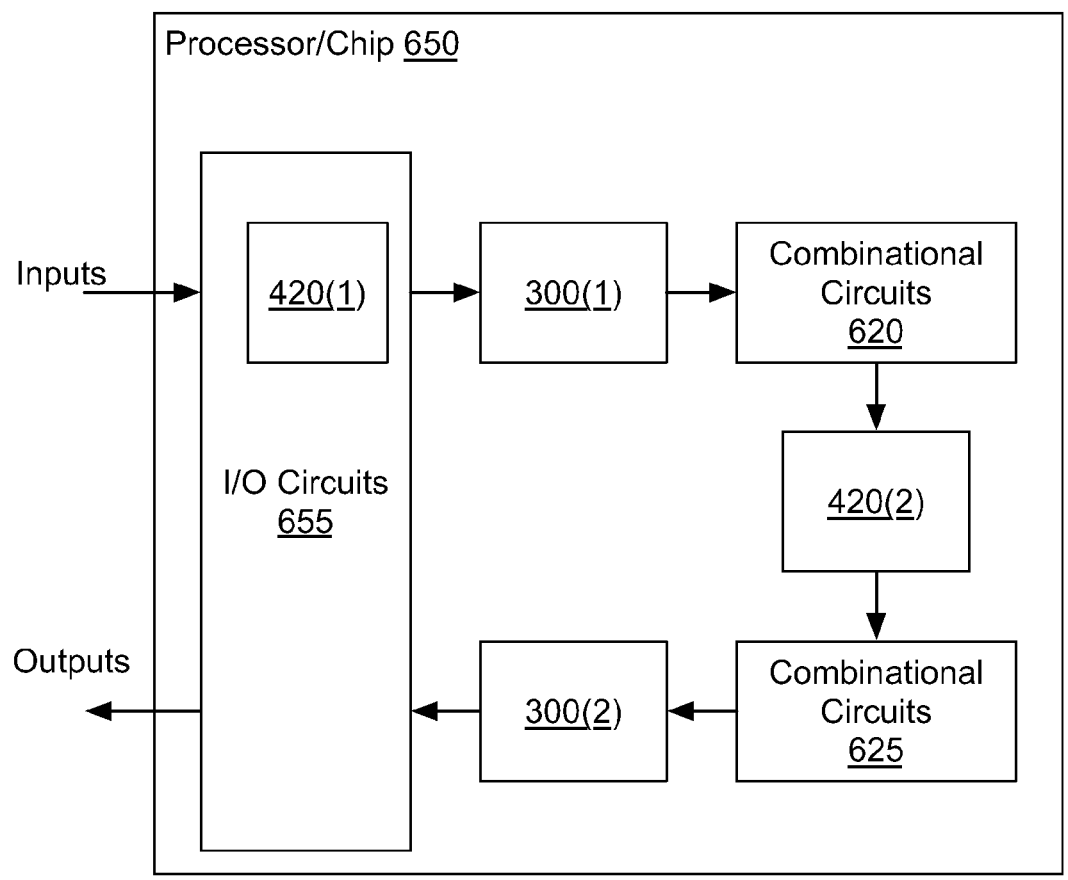
FIG. 6A is a block diagram illustrating a processor/chip including a design that is converted to use two-phase non-overlapping clocking, in accordance with accordance with one embodiment.

FIG. 6A is a block diagram illustrating a processor/chip 650 including a design that is converted to use two-phase non-overlapping clocking, in accordance with one embodiment. I/O circuits 655 may include pads and other I/O specific circuits to send and receive signals from other devices in a system. Outputs are produced by I/O circuits 655 based on signals received by the I/O circuits 655. The inputs received by the I/O circuits 510 are input to the first non-restoring master latch circuit with scan 420(1). Signals generated by the I/O circuits 655 are output to the non-restoring static latch 300(1). The combinational circuits 620 receive the output generated by the non-restoring static latch 300(1) and generate a combinational output that is received by the second non-restoring master latch circuit with scan 420(2). The second non-restoring master latch circuit with scan 420(2) stores the combinational output and generates an output that is input to the combinational circuits 625. The output of the combinational circuits 625 is received and stored by the second non-restoring static latch 300(2). The second non-restoring static latch 300(2) generates an output that is provided to the I/O circuits 655.

Figure 6B:
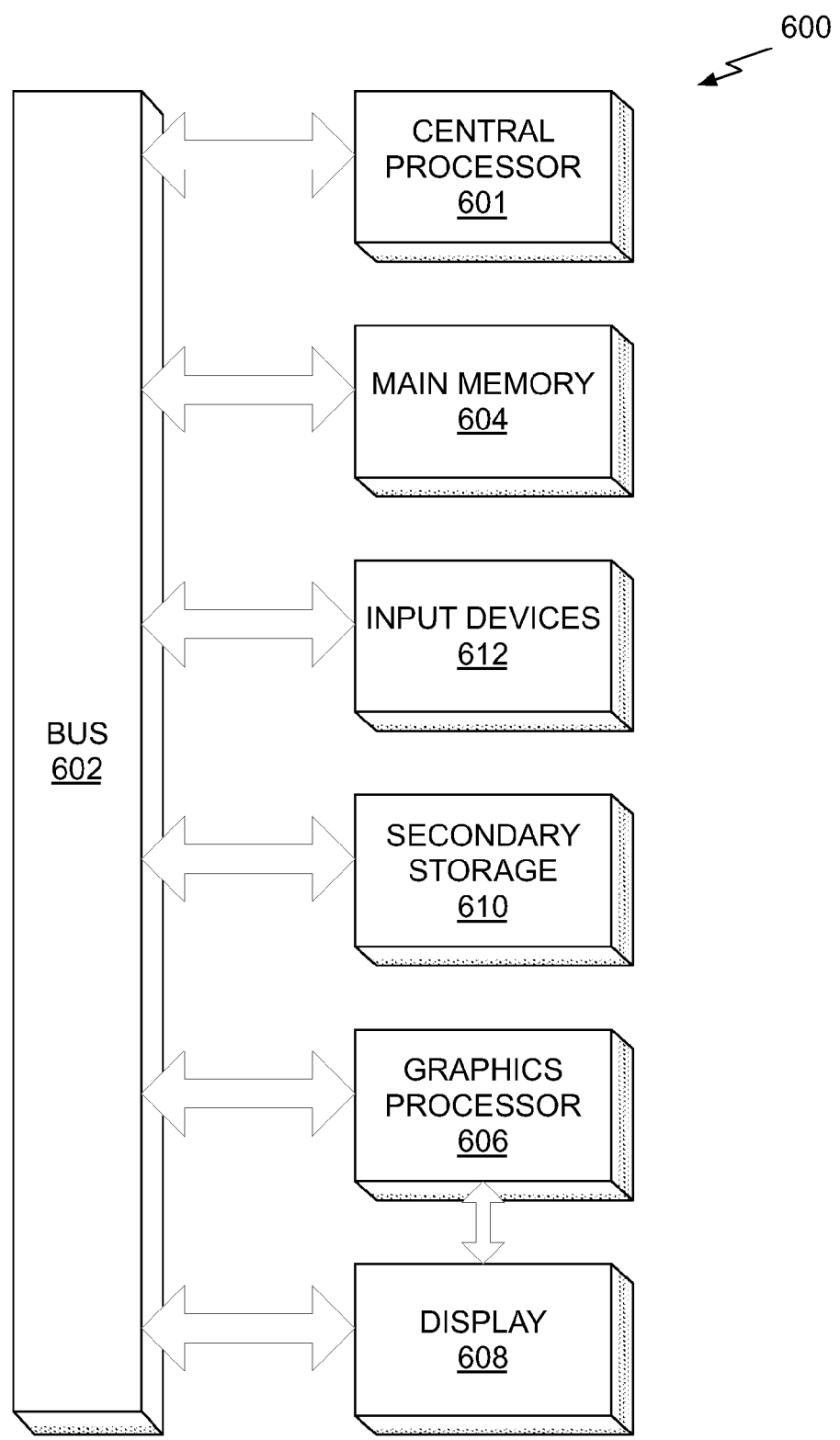
FIG. 6B illustrates an exemplary system in which the various architecture and/or functionality of the various previous embodiments may be implemented.

FIG. 6B illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PO-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The non-restoring static latch 300 and/or the non-restoring master latch with scan circuit 420 may be incorporated into one or more of the central processor 601, main memory 604, secondary storage 610, input devices 612, graphics processor 606, display 608, and bus 602.

The system 600 may also include a secondary storage 610. The secondary storage 610 includes, for example, a hard disk drive and/or removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   replacing, by a processor, a representation of an edge-triggered flip-flop circuit that is coupled to a combinational logic circuit with a pair of non-restoring latches including a first non-restoring latch circuit and a second non-restoring latch circuit, wherein the first non-restoring latch circuit and the second non-restoring latch circuit each comprise a transmission gate that is coupled to a keeper sub-circuit at the output of the non-restoring latch circuit;
   determining, by the processor, a node between a first portion of the combinational logic circuit and a second portion of the combinational logic circuit based on a propagation delay of a signal through the combinational logic circuit;
   propagating the second non-restoring latch circuit to the node; and
   providing two-phase non-overlapping clock signals to the pair of non-restoring latches.

2. The method of claim 1, wherein the first non-restoring latch circuit is clocked using a first clock signal of the two-phase non-overlapping clock signals and the second non-restoring latch circuit is clocked using a second clock signal of the two-phase non-overlapping clock signals that pulses during times within a clock period when the first clock signal is low.

3. The method of claim 1, wherein the first non-restoring latch circuit includes scan circuitry comprising a restoring drive gate on a scan path.

4. The method of claim 1, wherein, after the propagating, an output of the first non-restoring latch circuit is directly coupled to a drive gate at an input of the combinational logic circuit.

5. The method of claim 1, further comprising, during placement of the first non-restoring latch circuit and the combinational logic, limiting a length of a wire coupling an output of the first non-restoring latch circuit to the input of the combinational logic circuit.

6. The method of claim 1, further comprising inserting, by a processor, a restoring sub-circuit at an output of the first non-restoring latch circuit when the output is not directly coupled to a drive gate within the combinational logic circuit, after the propagating.

7. The method of claim 1, further comprising inserting, by a processor, a restoring sub-circuit at an output of the second non-restoring latch circuit when the output is not directly coupled to a drive gate within the combinational logic circuit, after the propagating.

8. A non-transitory computer-readable storage medium storing instructions that, when executed by a processor, cause the processor to perform steps comprising:
   replacing an edge-triggered flip-flop circuit that is coupled to a combinational logic circuit with a pair of non-restoring latches including a first non-restoring latch circuit and a second non-restoring latch circuit, wherein the first non-restoring latch circuit and the second non-restoring latch circuit each comprise a transmission gate that is coupled to a keeper sub-circuit at the output of the non-restoring latch circuit;
   determining a node between a first portion of the combinational logic circuit and a second portion of the combinational logic circuit based on a propagation delay of a signal through the combinational logic circuit;
   propagating the second non-restoring latch circuit to the node; and
   providing two-phase non-overlapping clock signals to the pair of non-restoring latches.

9. The non-transitory computer-readable storage medium of claim 8, wherein the first non-restoring latch circuit is clocked using a first clock signal of the two-phase non-overlapping clock signals and the second non-restoring latch circuit is clocked using a second clock signal of the two-phase non-overlapping clock signals that pulses during times within a clock period when the first clock signal is low.

10. The non-transitory computer-readable storage medium of claim 8, wherein an output of the first non-restoring latch circuit is directly coupled to a drive gate at an input of the combinational logic circuit.

11. The non-transitory computer-readable storage medium of claim 8, further comprising, during placement of the first non-restoring latch circuit and the combinational logic, limiting a length of a wire coupling an output of the first non-restoring latch circuit to the input of the combinational logic circuit.

12. A system, comprising:
   a memory configured to store a circuit design; and
   a processing unit configured to:
      replace an edge-triggered flip-flop circuit within the circuit design that is coupled to a combinational logic circuit with a pair of non-restoring latches including a first non-restoring latch circuit and a second non-restoring latch circuit, wherein the first non-restoring latch circuit and the second non-restoring latch circuit each comprise a transmission gate that is coupled to a keeper sub-circuit at the output of the non-restoring latch circuit;
      determine a node between a first portion of the combinational logic circuit and a second portion of the combinational logic circuit based on a propagation delay of a signal through the combinational logic circuit;
      propagate the second non-restoring latch circuit to the node; and
      provide two-phase non-overlapping clock signals to the pair of non-restoring latches.

13. The non-transitory computer-readable storage medium of claim 8, further comprising inserting a restoring sub-circuit at an output of the second non-restoring latch circuit when the output is not directly coupled to a drive gate within the combinational logic circuit after the propagating.

14. The system of claim 12, wherein processing unit is configured to insert a restoring sub-circuit at an output of the second non-restoring latch circuit when the output is not directly coupled to a drive gate within the combinational logic circuit after the second non-restoring latch circuit is propagated to the node.

* * * * *